United States Patent
Russell

(10) Patent No.: US 7,053,642 B2
(45) Date of Patent: May 30, 2006

(54) METHOD AND APPARATUS FOR ENABLING RELIABLE TESTING OF PRINTED CIRCUIT ASSEMBLIES USING A STANDARD FLYING PROBER SYSTEM

(76) Inventor: Robert J. Russell, 297 K St., South Boston, MA (US) 02127

( * ) Notice: Subject to any disclaimer, the term of this patent is extended or adjusted under 35 U.S.C. 154(b) by 142 days.

(21) Appl. No.: 10/953,161

(22) Filed: Sep. 29, 2004

(65) Prior Publication Data

US 2005/0073329 A1    Apr. 7, 2005

Related U.S. Application Data

(60) Provisional application No. 60/507,680, filed on Oct. 1, 2003.

(51) Int. Cl.
*G01R 31/02* (2006.01)

(52) U.S. Cl. ............ 324/758; 324/158.1; 324/754

(58) Field of Classification Search ............ None
See application file for complete search history.

(56) References Cited

U.S. PATENT DOCUMENTS

| | | | |
|---|---|---|---|
| 6,445,172 B1 * | 9/2002 | Park et al. | 324/158.1 |
| 6,563,324 B1 * | 5/2003 | Nichani | 324/537 |
| 6,621,275 B1 * | 9/2003 | Cotton et al. | 324/537 |

* cited by examiner

*Primary Examiner*—Ernest Karlsen
*Assistant Examiner*—Jimmy Nguyen

(57) ABSTRACT

A method and apparatus allows adapting a standard flying prober system to probe test point targets on Printed Circuit Assemblies (PCAs) having irregularities in their planarity. The method and apparatus involves positioning a camera utilized by the prober system to predetermined offset positions relative to previously established test and/or other points for sets of images. Each set of images is processed by determining offsets in coordinates needed to align the images in a predetermined manner. The offsets for each measured point are translated into actual height values to be used during subsequent testing of a PCA.

19 Claims, 8 Drawing Sheets

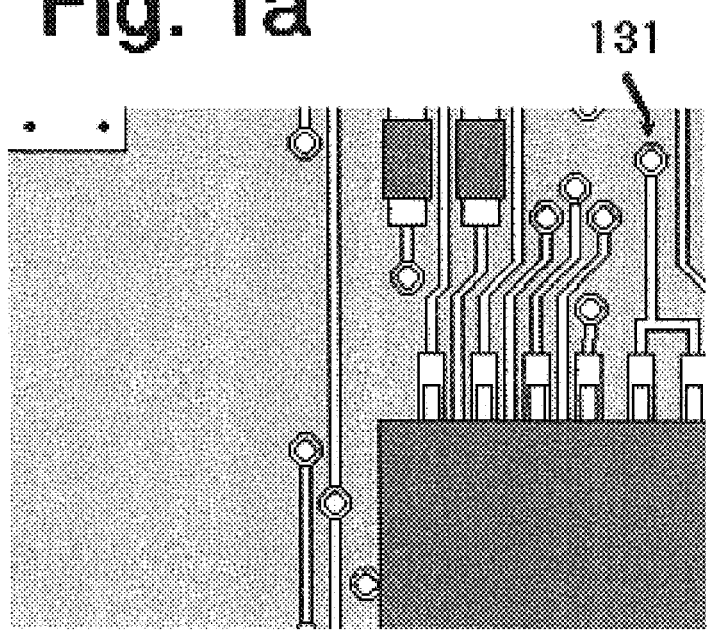

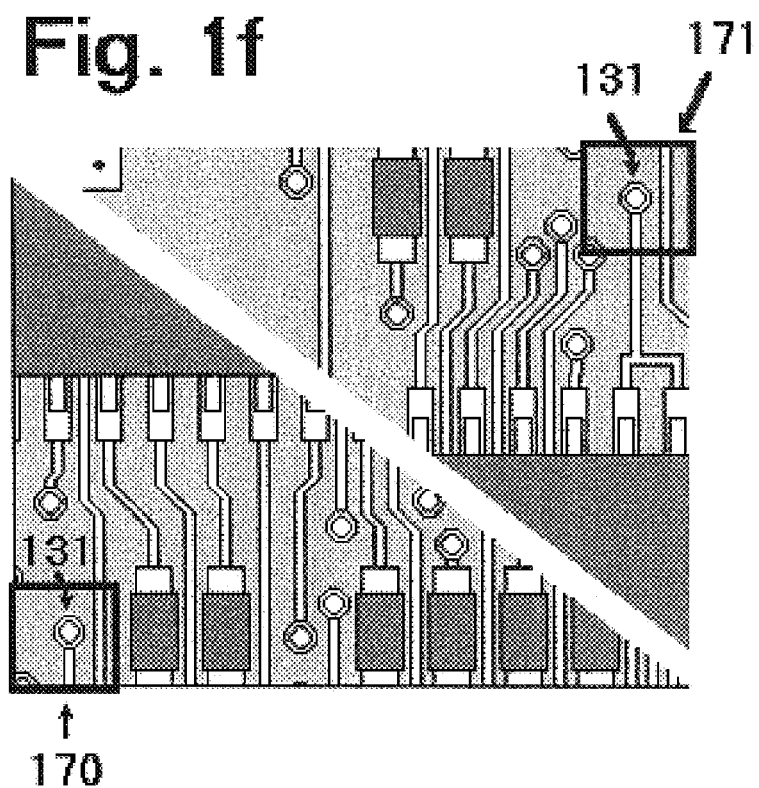

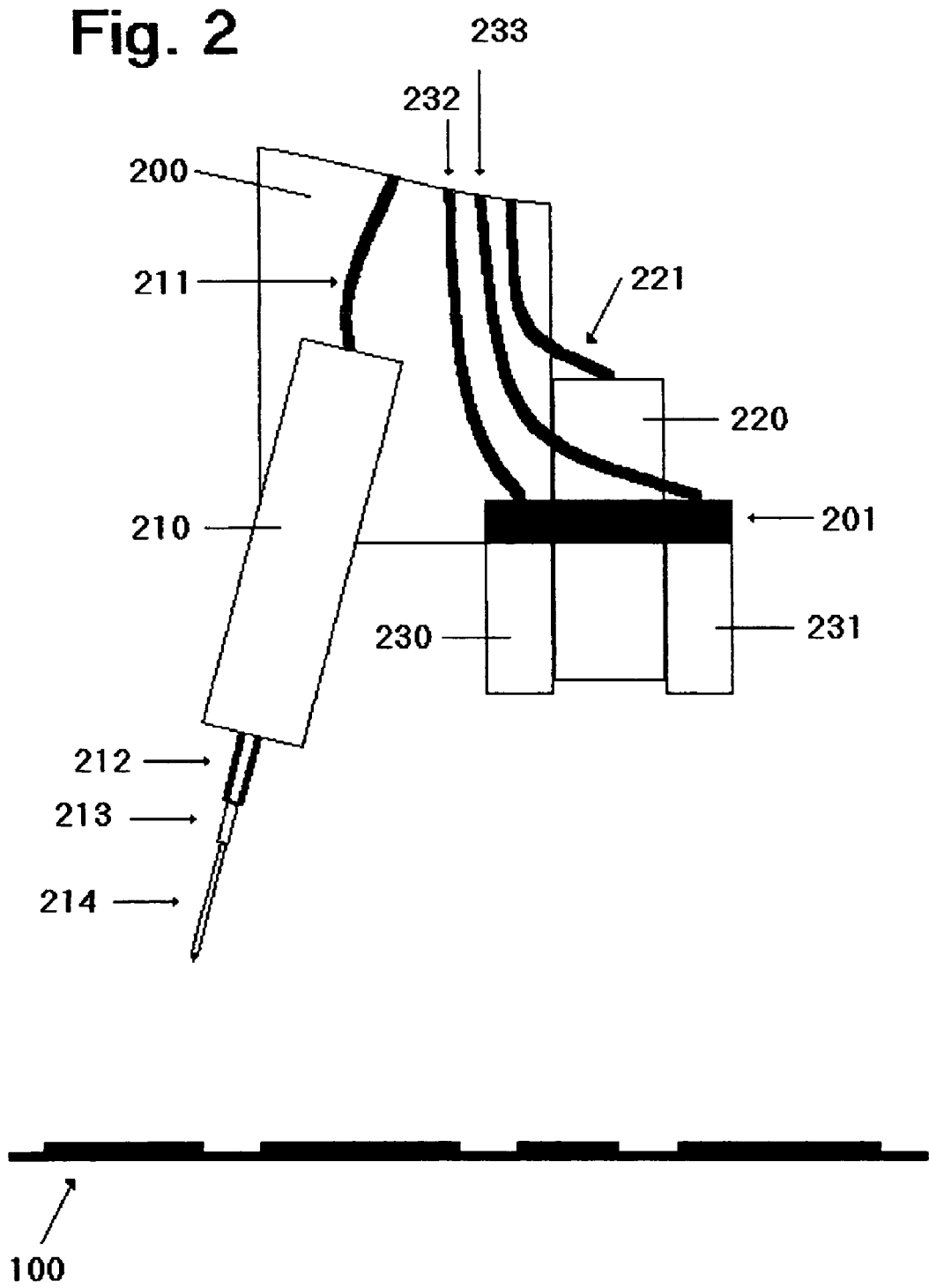

METHOD AND APPARATUS FOR ENABLING RELIABLE TESTING OF PRINTED CIRCUIT ASSEMBLIES USING A STANDARD FLYING PROBER SYSTEM

CROSS REFERENCE TO RELATED APPLICATIONS

This is a non-provisional patent application claiming priority of provisional application for Pat. No. 60/507,680 filed Oct. 1, 2003.

BACKGROUND OF THE INVENTION

1. Field of Use

The present invention relates to flying prober systems and more particularly to systems for enabling reliable testing of printed circuit assemblies (PCAs).

2. Prior Art

Modern Flying Probers are a class of In-Circuit Test (ICT) equipment which uses a plurality of moving probes in lieu of a standard bed of nails fixture to provide all or most connections between the PCA undergoing test and the test unit. Generally, flying prober tests are a subset of the tests that might have been performed by an ICT unit, because of the limited number of simultaneous connections possible between the PCA and tester. However, in present day test operations, such contact requirements have diminished compared with the recent past.

The principal benefit of flying probers is cost avoidance, in eliminating standard ICT bed of nails fixtures costing tens of thousands of dollars and having a short useful lifespan and little residual value. Another benefit is avoiding the delay associated with constructing such a fixture. Most flying probers have four moving probes, mechanically positionable to any board location by a relatively high speed mechanism. The list of board locations to be used in testing a given PCA type is generally derived from computer aided design (CAD) files provided as part of nearly all modern PCA designs. The same files are similarly used to define nail location points in a bed of nails fixture in non-flying prober testing. Alignment of the PCA on the flying prober is accomplished using electro-optical methods, whereby registration holes of the PCA that would be engaged when mounted on a bed of nails are, instead, found by image recognition methods and their precise locations recorded. Then, instead of mechanically aligning the PCA to the tester, the list of probing locations is recalculated to take into account the actual positions of the registration holes, essentially aligning the tester to the PCA instead of aligning the PCA to the fixture mounted on the tester.

The electro-optical system usually is or is the equivalent of a miniature television camera connected through a digitizer to the computer used to control the tester in its execution of a test program. In addition to its usefulness in PCA to tester alignment, the electro-optical system is used for other purposes related to testing. For example, the probing points may be sighted one by one for the benefit of the test programmer in verifying that the CAD data, upon which the test program is based, indeed matches the PCA for which a test program is being developed. Usually, the television camera used for this purpose is mounted on the carrier that also holds one of the probes. It is mounted in a position that is a predetermined offset from the probe itself. Thus, while the television camera system may not be able to display the probe as it touches the PCA, it can be placed directly over the point where the probe would touch the PCA had not the offset been applied. The camera's optics are aligned perpendicularly to the ideal plane of the PCA, allowing cross hairs or similar positional markings to be added to the image, creating a bombsight effect and allowing confirmation of theoretical probe positioning to a very high degree of precision. This display may also be used to verify the lack of probing obstacles in the vicinity of probing points or that the point is otherwise suitable for probing. One or more additional cameras are sometimes employed to further aide in test programming and/or execution, showing, for example a larger area of the PCA, and at an angle that allows watching some probes as they are extended to touch test points. The electro-optical system employed is sometimes sufficiently complex to allow Automated Optical Inspection (AOI) testing to be performed in conjunction with electrical flying prober tests.

While the nails of a standard ICT bed of nails fixture are mounted perpendicularly to the plane of the PCA while in its test position, flying fixture probing is performed at angles somewhat off perpendicular (Z axis). Angles of between five and sixteen degrees to the Z axis have been noted in some modern flying prober specifications. In some systems, the probe angle may be altered by test program commands. The angles are necessary to allow probing a series of closely spaced points by probes which are, by necessity, attached to relatively large drive mechanisms to allow speedy extension and withdrawal. Those mechanisms are in turn mounted to the carrier driven by an X-Y positioning mechanism. Two types of X-Y mechanisms used are linear motor and lead screw. Furthermore, the probes may be at angles to the X or Y axis as well as the Z axis. A single X-Y table of probe points suffices, regardless of the number of probes, variety of angles, or thickness of the particular PCA type being tested, by applying appropriate offsets as compensation for these effects in determining the precise point at which the PCA will be contacted.

However, the compensation discussed above is based upon the assumption that the probing points of the PCA exist in a perfect plane, or at predetermined differences from a perfect plane. Warpage of the PCA is both non-planar and unpredictable. Hence, planarity variations result in probing variations. In some cases, the intended test probing target may be probed slightly askew from the intended point of contact, usually the center. In other cases, the probe may miss the target altogether. For example, consider the case of a probe which is fifteen degrees from perpendicular attempting to probe a target point which is 35 mils in diameter. The required probing accuracy would be +/−17 mils, assuming the probe will not slide once one physical contact is made (not a safe assumption). At an angle of fifteen degrees, a 17 mil error occurs when the height of the intended target is approximately 1/16" (0.017"/0.268, the tangent of 15 degrees). The actual safe region for contacting a 35 mil target with a 15 degree probe is a matter of opinion. If, however, half the error were considered safe (about 8 mils), the height would have to be predictable to within approximately 1/32". Maintaining a planarity tolerance of +/−1/16" is generally not possible in a manufacturing environment with PCAs measuring 16" by 16" or more. Even with larger test targets, the planarity requirements are often impractical to maintain.

In the art of PCA testing using flying probers, planarity variations that cause a misprobe are a known problem, but there is a paucity of detailed data as to its significance. One result of a misprobe is a false error (e.g., when testing for resistance and getting an open indication) or a missed error (e.g., when a short was present but not detected). But, there are so many possible reasons for such errors, such a large quantity of such errors and so little engineering time to devote to making exact determination of error causes (real vs. false), that the effectiveness of available attempted solutions to the planarity problem has never been fully tested. Such attempted solutions are, e.g., standoff posts used to support a concave PCA from the underside during probing (but which may have no effect on convex PCAs) and standoff posts which attempt to apply either an upward or downward force, as needed, by means of vacuum applied over so small an area as to effect only relatively flexible PCAs. In all such cases, the required planarity cannot be guaranteed in a production environment.

Misprobes may also occur when the probing target is large enough that it will not be missed because of height differences. In such cases, the force applied by the probe may be inadequate, causing a lack of contact between the probe and PCA or too great, causing marking of the contact area. The marking may be in the form of a pit or a scored line, the latter resulting when the probe is pushed by excessive force. The marking occurs because probe contact depends upon spring force. In normal operation, contact force is achieved by attempting to drive the probe perhaps 50 to 100 mils further than would be required for the tip to make contact with the PCA probing point. At contact, the probe will stop moving and its internal spring will compress to take up the distance, providing contact pressure. In a case where the PCA contact point was significantly closer to the probing mechanism, early contact would be made and the probe might be driven 100 mils before the 100 mils previously referenced, for a total of 200 mils. In some cases, the spring might even fully compress, causing the probe to be driven against the PCA with the maximum force the probe extension motor can produce. In certain applications, the significant marking of PCA targets is not tolerated and the PCA has to be reworked or scrapped.

Accordingly, it is a primary objective of the present invention to provide a method and apparatus for overcoming variations in PCA board planarity of PCAs mounted for testing in a flying prober system.

It is a further objective of the present invention to utilize extensively hardware typically found on existing flying prober systems, making the retrofitting of such systems to incorporate the present invention practical.

SUMMARY OF THE INVENTION

The above and other objects of the present invention are achieved in a preferred embodiment of a method and apparatus which can be easily incorporated into an existing or standard flying prober system or included in the design of a new flying prober system. The method of the present invention includes additional processing and analysis of the data obtained from the electro-optical system, or television camera, referenced previously as used to provide a bombsight display to check the match of CAD data to the PCA being programmed and for other programming and test purposes. It involves extending the X-Y probe list to include height data (i.e. an X-Y-Z list). Once the height data has been added to the list, the appropriate offsets may be calculated and applied during the test program on a probe by probe basis in the same manner as the application of angular offsets previously described as being part of the standard flying prober system.

The apparatus utilized by the present invention, which may be considered optional in many cases, provides additional illuminators to enhance the television imaging process. Such apparatus many also include a new television imaging device able to operate closer to the PCA and/or having a wider field of view and/or greater resolution.

According to the present invention, the imaging system used to perform a bombsight check of alignment is positioned with points to be checked near the diagonal edges of the image instead of at the center. The points to be checked may be derived from the X-Y probing point list or otherwise selected, the former being convenient to use simply because it exists as part of the PCA CAD data and need not be separately obtained. Two images are obtained of each point selected for use. After the PCA and tester are in alignment, by virtue of the registration points having been found by the imaging system and the X-Y list recalculated as described previously, the imaging system is moved, by automatic program control, to a first point of which a height measurement is to be made. However, an offset is applied to the X-Y drive mechanism such that the point is positioned near one corner of the image. The image is then stored for subsequent processing. Next, the imaging system is moved to a point corresponding to the original X-Y location used before applying the previous offset and an equal but opposite offset is applied. Thus, the point selected for processing will appear in the opposite diagonal corner of the image from the image previously stored. The new image is then stored.

Also, according to the present invention, the area immediately surrounding the places where the points of interest in each of the two images is selected for comparison and one image is offset until it matches the other image within limits of reasonable certainty. The amount of offset required is proportional to the height of the probing point, as caused by the magnification of the imaging system lens. That is, if the PCA point being checked is higher (closer to the lens) than that of a PCA with perfect planarity, the offset required to match the two images would be greater than the offset required to match the two images found at normal height. Conversely, the offset required to match the images when the PCA was further from the lens would be less than the offset required to match two images found at normal height. Prior to testing of production PCAs and at regular intervals, a calibration method is used to determine the offset requirements for matching images resulting from points positioned at various distances from the lens, such that offsets may be related to specific distances.

In the preferred embodiment, to provide for consistent images of the area immediately surrounding the points being checked, an illumination system may be used. The system has two units, one unit which is as closely positioned as practical to being directly above the point being checked when the imaging system is ready to store the first image discussed above. The second unit will be similarly positioned as close as practical to directly overhead the same point when the imaging system is ready to store the second image discussed above. The two units are used one at a time as part of the imaging processing of the points directly under them.

A like series of steps are applied at a sufficient number of target points on the surface of the PCA board. The height of all X-Y target points of the PCA may be interpolated and later applied in determining individual offsets to be used in probing all target locations by any of the probes.

The above objects and advantages of the present invention will be better understood from the following description when taken in conjunction with the accompanying drawings.

BRIEF DESCRIPTION OF THE DRAWINGS

FIG. 1a. is a second section of FIG. 1 showing the view that would occur when a first offset is applied to the X-Y drive system that would otherwise be used to locate the imaging system directly above the point of interest shown in FIG. 1c.

FIG. 1b is similar to FIG. 1a, except that it shows the result of applying to the imaging system locator, an equal but opposite offset to the offset applied in FIG. 1a.

FIG. 1f is an illustration of how the offsets required to match the images from each of the two diagonal corners relate to the apparent distance between the two points caused by the magnification of the imaging system.

FIG. 2 shows the details of a flying prober probe carrier and the mounting of the probe mechanism and imaging system thereon.

DESCRIPTION OF THE PREFERRED EMBODIMENT

Figure 1:
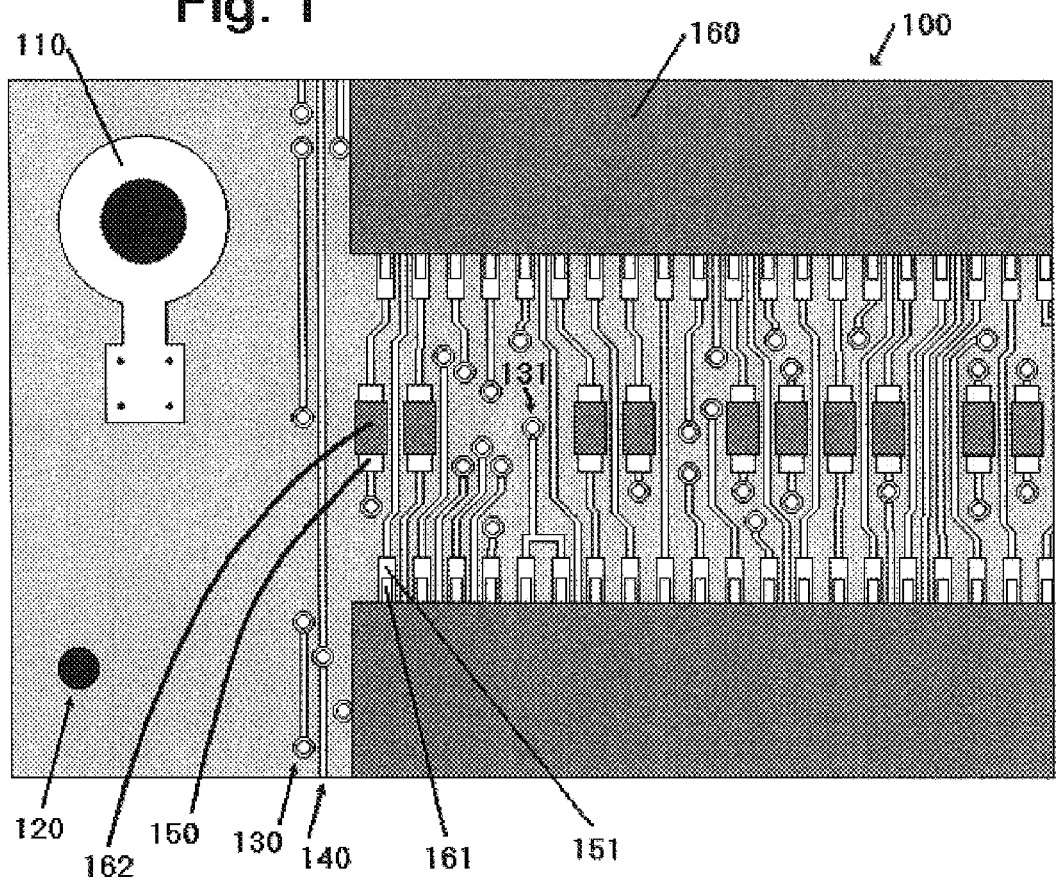
FIG. 1 shows an area of a sample PCA in detail, with the principal probing point to be used in explaining the operation found in the center of the drawing.

With reference to FIGS. 1 and 2, the principles of the present invention will now be described relative to its application to a particular system. The system is a standard or existing flying prober that uses an imaging system camera 220 with a diagonal field of view of about 20 degrees and a horizontal optical center positioned approximately four inches above the PCA being tested, 100. A probe carrier 200 is attached by means not shown to a conventional mechanism not shown used for moving carrier 200 about the flying prober in X-axis and Y-axis directions on a plane parallel to the ideal plane of PCA 100. Camera 220 and a bracket 201 are attached to carrier 200. A pair of illuminators 230 and 231 are attached to bracket 201 and are positioned along one horizontal axis formed by a diagonal of the rectangular image formed by the imaging system. Illuminators 230 and 231 are further positioned to be both equidistant from the vertical optical center of the imaging camera lens and as close as possible to 1.46 inches apart, measured from the vertical axis center of one illuminator to the equivalent point on the other. Each of the illuminators 230 and 231 may be designed to provide point sources of light except where they must be mounted significantly further apart than the desired distance, in which case only diffused light may be found to have the greatest effect. The illuminators 230 and 231 are selected to provide sufficient light to allow the imaging system lens to be operated at a small aperture, providing maximum depth of field without loss of resolution. A pair of cables 232 and 233 individually connect the two illuminators to a control system, allowing them to be selectively and separately turned on or off. In some cases, ambient lighting from other parts of the flying prober may be found sufficient, obviating illuminators 230 and 231. A cable 221 connects the imaging system camera 220 to other parts of the imaging system not shown.

A probe 214 is shown in a retracted position, nominally more than two inches above PCA 100. This distance allows X-axis and Y-axis movements of carrier 200 without striking most large components that might be mounted on a PCA. Probe 214 and a barrel 213 form an integral assembly within which a spring exists, causing a controlled force to be exerted between the tip of probe 214 and a point which it first contacts and then is further pushed against by moving barrel 213 closer to PCA 100. A probe holder designed to accommodate the probe assembly including barrel 213 and probe 214 forms part of a linear motor arm 212. Arm 212 is extended from or retracted into a linear motor module 210 through its connection to a control system via cable 211. The extension of arm 212 may be selectively controlled in increments of 10 mils from zero to 2.1 inches on an axis 15 degrees from perpendicular to the ideal plane of PCA 100. The 15 degrees is the angle from perpendicular at which motor module 210 is mounted to carrier 200. It should be noted that motor module 200 may or may not be aligned to the Y-axis of carrier 200 movement as a matter of flying prober system design choice.

In FIG. 1, a PCA area of nominally 2 by 3 inches is shown. A registration hole 120 is used in automatically aligning PCA 100 to the test system. Two other similar holes, not shown, would normally be used as part of the registration process. Integrated Circuit device(s) 160 is attached to PCA 100 by the surface mount process of soldering legs 161 to pad(s) 151. Similarly, discrete components 162 are surface mount process soldered to pad(s) 150. Etch(es) 140 are connected to device pad(s) 150 and/or 151 and to plated through hole(s) 130. Plated through hole 131 is similar to other holes 130, but is the target point of interest in determining a single item of PCA height data. Holes 130 and 131 are shown as solder filled, but could equally well be empty.

It is important to note that comparison at each point is made between two images of the same point from different camera positions and not to images of the same point on another PCA, such as might be termed a standard PCA of the type being tested That is, the present invention does not rely on consistency between one PCA and the next. For example, a particular target location on one of a series of PCAs of the type may be a solder filled hole, whereas another PCA of the same series may have an unfilled hole in the same location. Generally speaking, such variations would not negatively affect proper operation of the present invention.

Figure 1B:
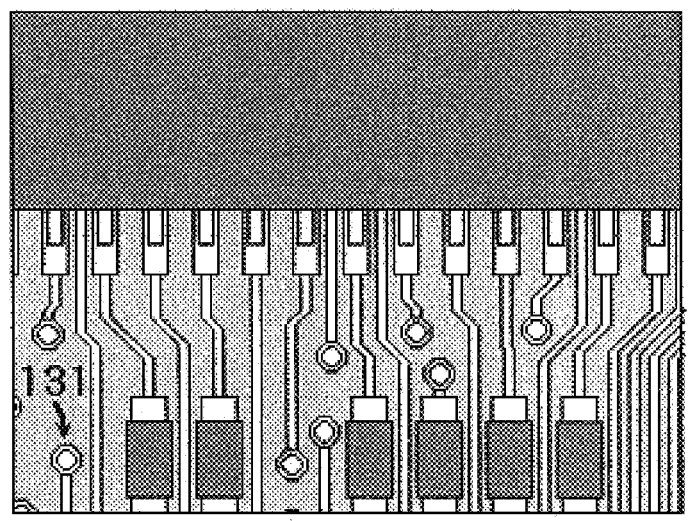
Figure 1C:
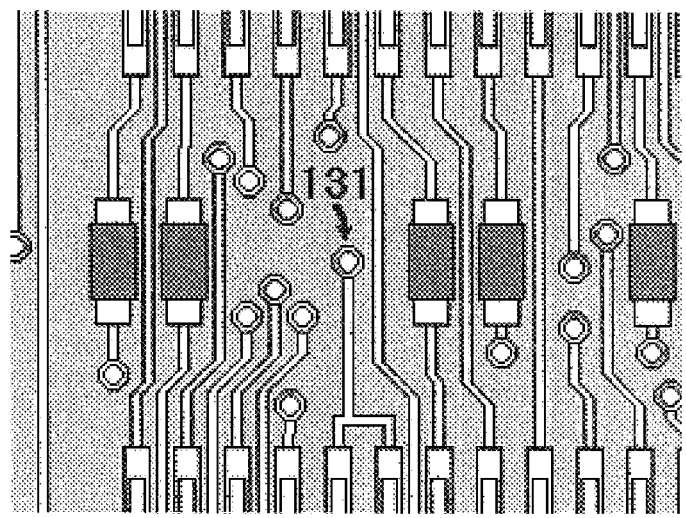
FIG. 1c. is a first section of FIG. 1, also centered on the same point, but showing a view that might be seen using the bomb sighting imaging system according to the present invention.
Figure 1D:
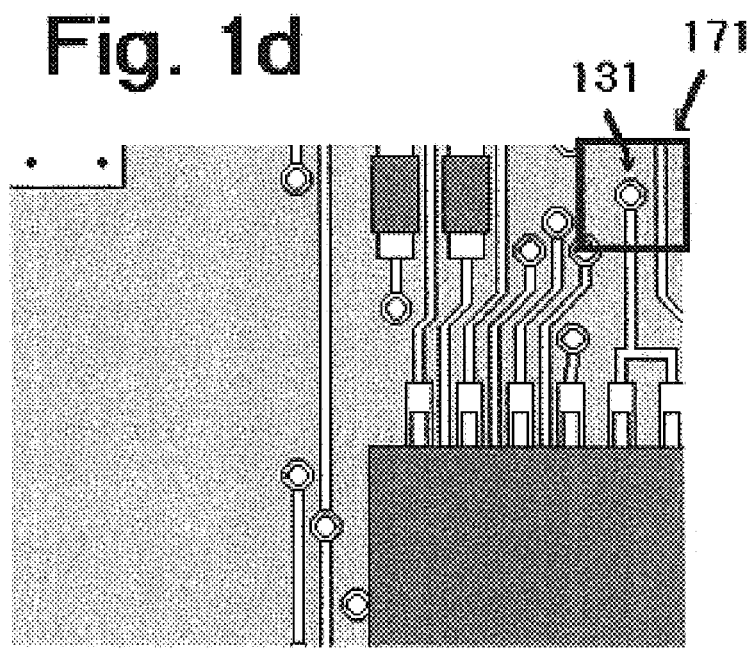
FIG. 1d is the same as FIG. 1a, except that a box has been included to point out the area of that image that will be used for comparison.
Figure 1E:
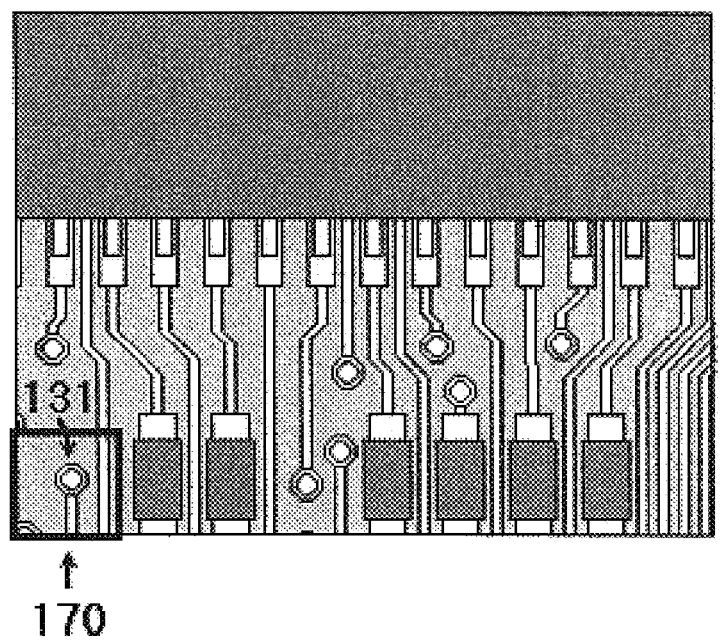
FIG. 1e is the same as FIG. 1b, except that a box has been included to point out the area of that image that will be used for comparison.

FIGS. 1a, 1b, 1c, 1d and 1e show the 1 inch by 1.33 inch area of the image produced by camera 220 in three camera positions. FIG. 1c shows the bombsight position directly above the X-Y location of probing location 131. In FIG. 1a, carrier 200 has been moved 0.728 inches from the position of FIG. 1c in a first direction along the diagonal axis of the image of FIG. 1c. In FIG. 1b, carrier 200 has been moved 0.728 inches in the opposite direction from the position of FIG. 1c along the same axis. In FIG. 1d, a 0.15 by 0.15 inch area has been highlighted (boxed) in the corner of the image occupied by hole 131 of FIG. 1a. Similarly, in FIG. 1e, a 0.15 inch by 0.15 inch area has been highlighted in the corner of the image occupied by hole 131 in FIG. 1e. In FIG. 1f., FIGS. 1d and 1e are merged into a single image to aid in developing a better understanding of how the individual corner images relate to an effective separation between the same point viewed from two distinct positions. The images of FIGS. 1a through 1f represent those of a section of a PCA and, in particular, of an individual test point 131, which is located upon the ideal test plane (i.e., neither higher nor lower). Height variation of the PCA would cause the images to be magnified or reduced, thereby causing test point 131 to be further from or closer to the center of each image and, in particular, towards the inner or outer corners of image capture areas 170 and 171. (The inner corners being those capturing the portion of the image closest to the center of entire field captured by the imaging system, the outer corners being those diagonally opposite.) Hence, for example, a test point 130 which is closer to the imaging system lens by virtue of a PCA height variation will produce images where that test point 130 is proportionally closer to the outer corners of image capture areas 170 and 171 than would be the case of the equivalent test point 130 on a PCA having no height variation.

Description of Operation

With reference to FIGS. 1 and 2, operation of the preferred embodiment will now be described. The operation will be described relative to a specific example but the invention is not in any way limited to such use.

It is assumed that the system has been previously calibrated such that the image qualities of a single pair of offset images on a plane of a $3/16$ inch thick calibration PCA and a single pair of offset images on a plane of a $1/4$ inch thick calibration PCA are both stored within the system. It is further assumed that a series of points have been predetermined that are more or less evenly spaced across the production PCA and are sufficiently close enough to each other that the height of any point on the PCA may, with sufficient accuracy, be estimated by interpolating from the list of nearby points for which the height has been actually determined using the present invention. As stated previously, these points may be directly extracted from the system list of X-Y probable points or a list separately developed or from a combination thereof. In addition to the stated list of distributed points, a list of alternative nearby points also may be included to provide for cases where the height of a particular location cannot be determined for one reason or another.

The operation according to the present invention proceeds as follows using the list of points.

Step 1. Select a first point from the list.

Step 2. Turn illuminator 230 on and illuminator 231 off (allow for lamp delay if necessary).

Step 3. Move camera 220 to X, Y of selected point then apply an offset of X−0.591, Y−0.425. (illuminator 230 is thereby directly above X, Y position.)

Step 4. Capture a first 150 mil by 150 mil corner portion 170 of the image under illuminator 230.

Step 5. Turn illuminator 230 off, 231 on (allow for lamp delay if necessary).

Step 6. Move camera to X, Y of selected point then apply an offset of X+0.591, Y+0.425. (Illuminator 231 is thereby directly above X, Y position.)

Step 7. Capture a second 150 mil by 150 mil corner portion 171 of the image under illuminator 231.

Step 8. Process the first and second portions of the images to determine offset needed to achieve favorable match between any 100 mil by 100 mil portion of the image captured in Step 7 with any same sized portion of the image captured in Step 4. If no match made, select a nearby alternate point, if available, or the next point of any further points on the list, if not.

Step 9. Translate the X, Y offsets at each point measured into actual height values. An offset of zero would be found where the PCA top surface (the surface closest to the probes) was $3/16$" above the surface of an ideal PCA of zero thickness. An X, Y offset of the imaged equivalent of adding 23 mils to the distance between the same points on the first and second images (in steps 4 and 7) is the value previously stored in the calibration phase when comparing the relative distances of the $3/16$ inch thick and $1/4$ inch thick portions of the calibration PCA. (The image equivalent of 1.457 inches becomes 1.481 inches equivalent when $1/16$ inch closer to the lens.)

It is seen from the above that the apparatus and method of the present invention may readily be incorporated by those skilled in the art into standard flying prober systems with few modifications. Such modifications may be exclusively software modifications, if they are, in and of themselves, found to provide sufficient height measurement accuracy for the PCAs desired to be tested. Additionally, electro-optical systems with greater resolution and accuracy may be incorporated, including those using wider or non-linear fields of view or zoom lenses and various forms of illumination to augment those systems While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

The invention claimed is:

1. A method for reducing the number of misprobes by a flying probe system used in testing circuit boards which contain a number of pre-established test points definable by x, y and z co-ordinates, the system including at least one probe, a storage unit for storing values representing the x, y and z coordinates for the pre-established points, the probe including a camera attached thereto for pretest determination of proper x and y co-ordinate positioning of test and other points during testing using a screen area containing a cross hair or similar positional marking which is normally positioned in the center of the screen area for proper alignment of a point on the PCA, the method comprising the following steps performed prior to any testing:

(a) selecting one of the previously established points, positioning the cross hair or similar positional marking on the screen area from a center position defined by the x and y coordinates of the point to a first predetermined offset position;

(b) capturing a first predetermined corner portion of the image at the first offset position and recording that as a first image;

(c) next, positioning the cross hair or similar positional marking for the selected point from the center position to a second offset position opposite to the first offset position;

(d) capturing a second predetermined corner portion of the image at the second offset position and recording that as a second image;

(e) processing the first and second images by determining the offset in coordinates needed to align equivalent portions of the images so that they match; and, (f) translating the offsets determined in step (e) for the measured point into actual height values to be used for probing the selected and or neighboring point(s) during subsequent testing of the PCA for providing accurate results by reduction of the number of misprobes.

2. The method of claim 1 wherein steps a through d are repeated for each of a selected number of pre-established test points for enabling accurate testing of the entire PCA.

3. The method of claim 1 wherein the points correspond to test points to be used in the testing of the PCA.

4. The method of claim 1 wherein the points define other features of the PCA.

5. The method of claim 1 wherein steps a through f are incorporated into the programming of the flying probe system.

6. The method of claim 2 wherein the selected number of pre-established points is a function of PCA size.

7. The method of claim 1 wherein when step e indicates the test point is higher than would be found on a PCA with perfect planarity, that determination being made by the having to perform the equivalent of reducing the X, Y offset of the two images in order to achieve a match, the amount of offset being in proportion to the difference in height.

8. The method of claim 1 wherein when step e indicates the test point is lower than would be found on a PCA with perfect planarity, that determination being made by having to perform the equivalent of increasing the X, Y offset of the two images in order to achieve a match, the amount of offset being in proportion to the difference in height.

9. The method of claim 1 wherein the test system in calibrated using one or more PCAs having at least two thicknesses.

10. The method of claim 1 wherein steps a through f are repeated for one or more test points using offset values based on results initially obtained for those points.

11. The method of claim 10 wherein the process of repeating steps a through f continues until the offset required to achieve image matching is of a certain minimum value.

12. The method of claim 1 where the method further includes the step of rejecting the PCA upon detection of having exceeded a pre-established threshold of warpage.

13. The method of claim 1 wherein the method further includes the step of selectively illuminating the first and second offset positions for accurately capturing the images obtained in steps (b) and (d).

14. Apparatus for reducing the number of misprobes by a flying probe system used in testing circuit boards which contain a number of pre-established test points definable by x, y and z co-ordinates, the system including at least one probe, a storage unit for storing values representing the x, y and z coordinates for the pre-established points, the probe including a camera attached thereto for pretest determination of proper x and y co-ordinate positioning of test and other points during testing using a screen area containing a cross hair or similar positional marking which is normally positioned in the center of the screen area for proper alignment of a point on the PCA, the apparatus comprising:

(a) means for selecting one of the previously established points and positioning the cross hair or similar positional marking on the screen area from a center position defined by the x and y coordinates of the point to a first predetermined offset position;

(b) a camera device capturing a first predetermined corner portion of the image at the first offset position and recording that as a first image;

(c) next, the means for selecting positioning the cross hair or similar positional marking for the selected point from the center position to a second offset position opposite to the first offset position;

(d) the camera device capturing a second predetermined corner portion of the image at the second offset position and recording that as a second image;

(e) means for processing the first and second images by determining the offset in coordinates needed to align equivalent portions of the images so that they match; and, (f) means for translating the offsets determined by the processing means for the measured point into actual height values to be used for probing the selected and or neighboring point(s) during subsequent testing of the PCA for providing accurate results by reduction of the number of misprobes.

15. The apparatus of claim 14 wherein the means for selecting and camera device perform the operations of selecting, positioning and capturing for each of a selected number of pre-established test points for enabling accurate testing of the entire PCA.

16. The apparatus of claim 14 wherein the points correspond to test points to be probed in the testing of the PCA.

17. The apparatus of claim 14 wherein the points correspond to other features of the PCA.

18. The apparatus of claim 14 wherein the apparatus is controlled by the programming of the flying probe system.

19. The apparatus of claim 15 wherein the selected number of pre-established points is a function of PCA size.

* * * * *